(12) United States Patent
Marth

(10) Patent No.: US 12,444,654 B2
(45) Date of Patent: Oct. 14, 2025

(54) SYSTEMS AND METHODS FOR DETERMINING FLOW CHARACTERISTICS OF A FLUID SEGMENT FOR ANALYTIC DETERMINATIONS

(71) Applicant: Elemental Scientific, Inc., Omaha, NE (US)

(72) Inventor: Beau A. Marth, La Vista, NE (US)

(73) Assignee: Elemental Scientific, Inc., Omaha, NE (US)

( * ) Notice: Subject to any disclaimer, the term of this patent is extended or adjusted under 35 U.S.C. 154(b) by 516 days.

(21) Appl. No.: 17/882,027

(22) Filed: Aug. 5, 2022

(65) Prior Publication Data

US 2023/0050586 A1    Feb. 16, 2023

Related U.S. Application Data

(60) Provisional application No. 63/232,901, filed on Aug. 13, 2021.

(51) Int. Cl.
  *H01L 21/66*    (2006.01)
  *G01F 1/58*    (2006.01)
  (Continued)

(52) U.S. Cl.
  CPC ......... *H01L 22/12* (2013.01); *G01N 21/9501* (2013.01); *H01L 22/26* (2013.01); *G01F 1/58* (2013.01); *G01F 23/2845* (2013.01)

(58) Field of Classification Search
  CPC ........ G01F 1/708; G01F 1/58; G01F 23/2845; H01L 22/12; H01L 22/26; G01N 21/9501; G01N 2035/1025
  (Continued)

(56) References Cited

U.S. PATENT DOCUMENTS 6,164,133 A    12/2000    Watanabe
6,521,187 B1 *    2/2003    Papen ..................... G01F 1/48
                                                          73/863.02
(Continued)

FOREIGN PATENT DOCUMENTS

CN    112802767 A  *  5/2021  ............. H01L 22/12
JP    2005326365 A  *  11/2005
KR    20180016606 A    2/2018

OTHER PUBLICATIONS

Translation JP-2005326365 (Year: 2005).*
(Continued)

*Primary Examiner* — Peter J Macchiarolo
*Assistant Examiner* — Monica S Young
(74) *Attorney, Agent, or Firm* — Kevin E. West; Advent, LLP

(57) ABSTRACT

Systems and methods are described for determining whether liquid remains on a wafer surface following a scanning operation. A system embodiment includes, but is not limited to, a first system configured for positioning adjacent a transfer line coupled with a scanning nozzle to dispense fluid onto a wafer surface and to recover the fluid from the wafer surface, the first system configured to detect a gas/liquid transition of the fluid and determine a volume of liquid sample dispensed; a second system configured for positioning adjacent a second line downstream from the scanning nozzle, the second system configured to detect a gas/liquid transition of fluid flowing through the second line and determine a volume of liquid sample recovered from the wafer surface; and a controller configured to generate an alert if the volume of liquid sample recovered is not within a threshold amount compared to the volume of liquid sample dispensed.

8 Claims, 9 Drawing Sheets

(51) Int. Cl.
  *G01F 23/284* (2006.01)
  *G01N 21/95* (2006.01)
(58) Field of Classification Search
  USPC .......................................................... 73/149
  See application file for complete search history.

(56) References Cited

U.S. PATENT DOCUMENTS

| | | | |
|---|---|---|---|
| 9,041,901 | B2 | 5/2015 | Hara et al. |
| 11,742,230 | B2* | 8/2023 | Palsulich ................ H01L 22/12 |
| | | | 438/14 |
| 2006/0232757 | A1* | 10/2006 | Tani .................... G03F 7/70975 |
| | | | 355/53 |
| 2007/0044572 | A1* | 3/2007 | Davis ........................ G01P 5/20 |
| | | | 73/861.42 |
| 2008/0187872 | A1* | 8/2008 | Tsukamoto ......... G03F 7/70341 |
| | | | 355/53 |
| 2009/0128793 | A1* | 5/2009 | Hara ................... G03F 7/70533 |
| | | | 355/53 |
| 2011/0170080 | A1* | 7/2011 | Tani .................... G03F 7/70925 |
| | | | 355/30 |
| 2019/0172731 | A1* | 6/2019 | Yost .................... H01L 21/6708 |
| 2021/0148858 | A1 | 5/2021 | Kkawabata et al. |

OTHER PUBLICATIONS

Translation CN-112802767 (Year: 2021).*
Jan. 7, 2025 International Search Report and Written Opinion for Application No. PCT/US2022/039559, dated Nov. 29, 2022.

* cited by examiner

SYSTEMS AND METHODS FOR DETERMINING FLOW CHARACTERISTICS OF A FLUID SEGMENT FOR ANALYTIC DETERMINATIONS

BACKGROUND

Inductively Coupled Plasma (ICP) spectrometry is an analysis technique commonly used for the determination of trace element concentrations and isotope ratios in liquid samples. ICP spectrometry employs electromagnetically generated partially ionized argon plasma which reaches a temperature of approximately 7,000K. When a sample is introduced to the plasma, the high temperature causes sample atoms to become ionized or emit light. Since each chemical element produces a characteristic mass or emission spectrum, measuring the spectra of the emitted mass or light allows the determination of the elemental composition of the original sample.

Sample introduction systems may be employed to introduce the liquid samples into the ICP spectrometry instrumentation (e.g., an Inductively Coupled Plasma Mass Spectrometer (ICP/ICP-MS), an Inductively Coupled Plasma Atomic Emission Spectrometer (ICP-AES), or the like) for analysis. For example, a sample introduction system may transport an aliquot of sample to a nebulizer that converts the aliquot into a polydisperse aerosol suitable for ionization in plasma by the ICP spectrometry instrumentation. The aerosol generated by the nebulizer is then sorted in a spray chamber to remove the larger aerosol particles. Upon leaving the spray chamber, the aerosol is introduced into the plasma by a plasma torch assembly of the ICP-MS or ICP-AES instruments for analysis.

SUMMARY

Systems and methods are described for determining flow characteristics of a fluid segment flowing through a fluid transfer line. A system embodiment includes, but is not limited to, a first liquid volume determination system configured for positioning adjacent a first fluid transfer line in fluid communication with a scanning nozzle configured to dispense a fluid onto a wafer surface and to recover the fluid from the wafer surface for transfer to an analytical system, the first liquid volume determination system configured to detect a gas/liquid transition of fluid flowing through the first fluid transfer line and determine a volume of liquid sample dispensed onto the wafer surface; a second liquid volume determination system configured for positioning adjacent a second fluid transfer line downstream from the scanning nozzle and the first liquid volume determination system, the second liquid volume determination system configured to detect a gas/liquid transition of fluid flowing through the second fluid transfer line and determine a volume of liquid sample recovered from the wafer surface; and a controller configured to compare the volume of liquid sample recovered from the wafer surface to the volume of liquid sample dispensed onto the wafer surface and to generate an alert if the volume of liquid sample recovered from the wafer surface is not within a threshold amount compared to the volume of liquid sample dispensed onto the wafer surface.

A method embodiment includes, but is not limited to, transferring a fluid sample through a fluid transfer line from a fluid source to a scanning nozzle of a wafer processing system; dispensing the fluid sample onto a wafer surface with the scanning nozzle; determining, via a first liquid volume determination system positioned downstream from the fluid source and upstream from the scanning nozzle, a volume of liquid sample dispensed onto the wafer surface; recovering the fluid sample from the wafer surface with the scanning nozzle; determining, via a second liquid volume determination system positioned downstream from the scanning nozzle, a volume of liquid sample recovered from the wafer surface; comparing, via a controller communicatively coupled with the first liquid volume determination system and the second liquid volume determination system, the volume of liquid sample recovered from the wafer surface to the volume of liquid sample dispensed onto the wafer surface; and generating an alert if the volume of liquid sample recovered from the wafer surface is significantly less than the volume of liquid sample dispensed onto the wafer surface.

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

DRAWINGS

The Detailed Description is described with reference to the accompanying figures. The use of the same reference numbers in different instances in the description and the figures may indicate similar or identical items.

DETAILED DESCRIPTION

Overview

Figure 1:
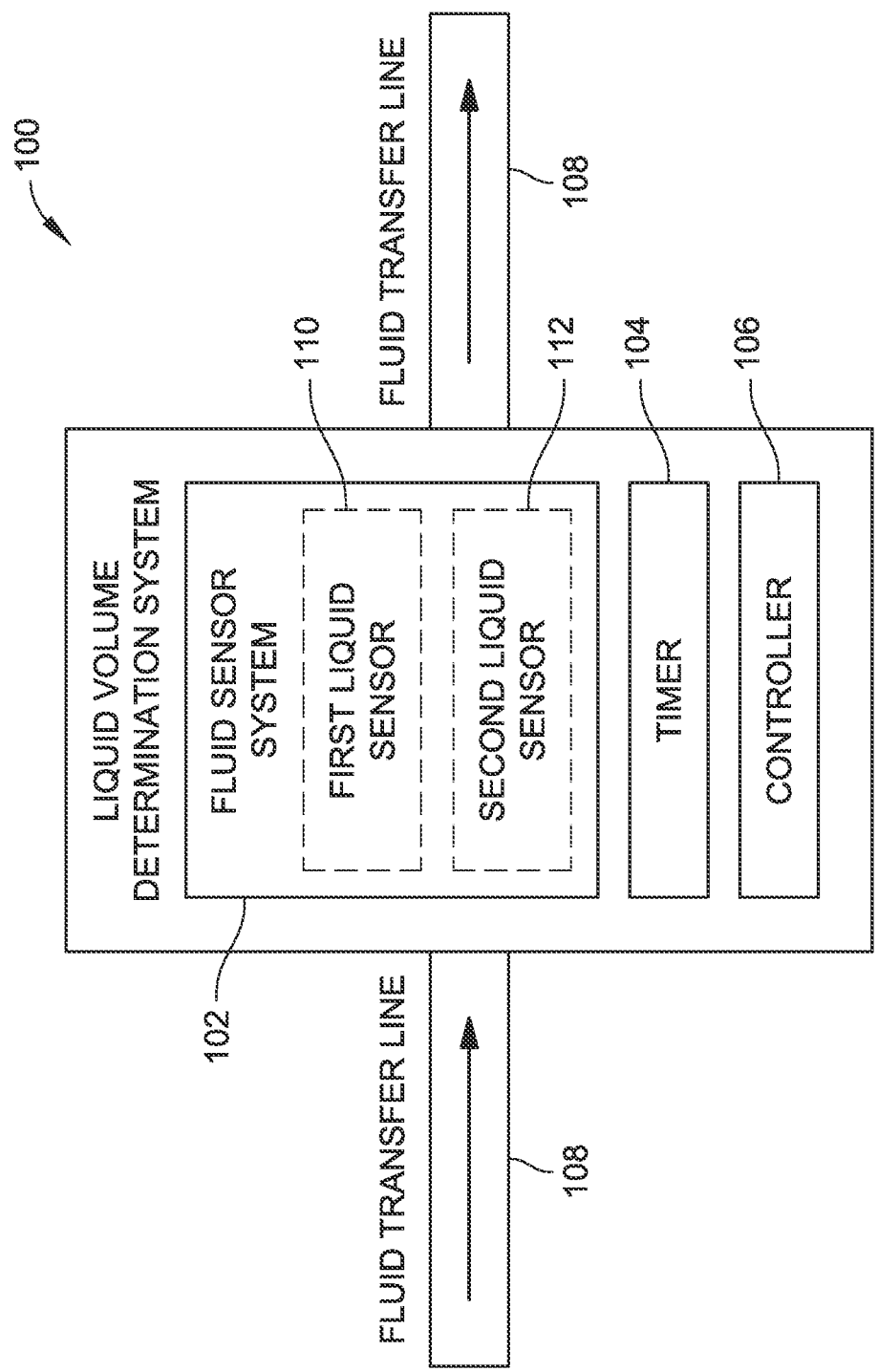
FIG. 1 is a diagrammatic illustration of a system for determining volume of a liquid sample flowing through a fluid transfer line, in accordance with embodiments of this disclosure.

Determination of trace elemental concentrations or amounts in a sample can provide an indication of purity of the sample, or an acceptability of the sample for use as a reagent, reactive component, or the like. For instance, in certain production or manufacturing processes (e.g., mining, metallurgy, semiconductor fabrication, pharmaceutical processing, etc.), the tolerances for impurities can be very strict, for example, on the order of fractions of parts per billion. For semiconductor wafer processing, the wafer is tested for impurities, such as metallic impurities, that can degrade the capabilities of the wafer or render the wafer inoperable due to diminished carrier lifetimes, dielectric breakdown of wafer components, and the like.

Vapor phase decomposition (VPD) and subsequent scanning of the wafer is a technique to analyze the composition of the wafer to determine whether metallic impurities are present. Traditional VPD and scanning techniques have limited throughput for facilitating the treatment and scanning of silicon wafers for impurity analysis. For instance, systems often utilize separate chambers for the VPD procedure and for the scanning procedure. In the VPD chamber, silicon dioxide and other metallic impurities present at the surface are contacted with a vapor (e.g., hydrofluoric acid (HF), hydrogen peroxide ($H_2O_2$), combinations thereof) and removed from the surface as vapor (e.g., as silicon tetrafluoride ($SiF_4$)). The treated wafer is transported to a separate chamber for scanning, where a liquid droplet is introduced to the treated wafer surface to collect residue following reaction of the decomposition vapor with the wafer. The scanning procedure can involve holding a droplet on the surface of the wafer with a scan head and rotating the wafer, while moving the scan head or keeping the scan head stationary to move the droplet over the surface. After multiple revolutions of the wafer, the droplet interacts with the desired surface area of the wafer to draw any residue from the contacted surface following decomposition. However, traditional wafer treatment techniques require significant amounts of time and equipment to process a wafer, such through movement of the wafer from a decomposition chamber to a scan chamber to a rinse chamber during treatment, utilizing scan nozzles that have limited droplet interaction with the wafer surface during scanning (i.e., requiring multiple revolutions of the wafer to interact the droplet with the entire surface area or a portion thereof), and the like. Moreover, such handling of the wafer can potentially expose technicians or other individuals to toxic hydrofluoric acid or can increase the risk of environmental contamination to the wafer during transfer of the wafer between the various process chambers, which also require a substantial physical process floor footprint to facilitate the equipment and transfer mechanisms between the equipment.

Scanning systems used in analysis of wafers and other structures typically rely on the amount of fluid introduced to the surface of the material being analyzed to calculate the composition of content of samples removed from the surface. If the amount of fluid presumed to have been introduced to the surface differs from the actual amount introduced, then errors can be introduced to calculations of materials removed from the surface (e.g., via concentration analysis). Additionally, if the amount of fluid removed from the surface following a scan differs from the amount of fluid introduced to the surface to perform the scan, then the surface could include residual fluid that is not being removed from the surface, which can require additional cleaning and disposing operations, can lead to errors during analytical determinations of content of the materials removed from the surface via the fluid, or the like. Systems using a single liquid detector can estimate a volume of a liquid segment flowing through a fluid line by measuring a time period that the liquid detector detects the fluid. The estimate relies on the flowrate being known and constant for the estimate to be accurate, however in real life fluid transfer scenarios, the flow rate is rarely constant and can vary greatly between samples based on various reasons including, but not limited to, differing liquid viscosities, impurities in the transfer line, pump inaccuracies, environmental temperatures, and the like.

Accordingly, the present disclosure is directed, at least in part, to systems and methods for determining flow characteristics of a fluid segment flowing through a fluid transfer line to measure or otherwise calculate volumetric flow rate and volume of liquid present in the fluid segment. A system can include a fluid transfer line having at least two fluid sensors configured to measure the flow of fluid through the fluid transfer line by detecting gas/liquid interfaces in the fluid transfer line and monitoring the time period between different gas/liquid interfaces. For example, the fluid sensors can measure the presence or absence of liquid or gas to differentiate between liquid and gas in the fluid transfer line. Example fluid sensors include, but are not limited to, optical sensors, pressure sensors, ultrasonic transducers, conductivity sensors, or the like, and combinations thereof.

The fluid sensors are positioned with a gap between the fluid sensors having a known volume, distance, or combinations thereof. As a moving segment of fluid passes between two fluid sensors, the flowrate of liquid within the segment is determined by measuring the time period elapsed during travel of the liquid from the first fluid sensor to the second fluid sensor and dividing the volume of the gap between the two fluid sensors by the time period. The system can determine multiple flowrates for a given fluid segment, such as to provide an average flow rate of the fluid segment. For example, a starting flowrate of the fluid segment can be determined based on measuring the front end of a liquid portion of the sample as it travels from the first fluid sensor until detected by the second fluid sensor and an ending flowrate of the fluid segment can be determined based on measuring the back end of the liquid portion of the sample as it travels from the first fluid sensor until detected by the second fluid sensor. The volume of the liquid portion can be determined by dividing the total time the fluid sensors sensed the sample segment by the flowrate measured by the system (e.g., the average flowrate). In implementations, the system determines the volume of air gaps in the transfer line by monitoring the absence of the liquid portions of the fluid segment and calculating the volume of the air gaps in the same manner as calculating the volume of the liquid portions. The volume of the air gaps can be subtracted from the volume of the fluid sample to provide liquid volume determinations or enhance accuracy thereof.

Example Implementations

FIGS. 1 through 8 illustrate aspects of a system for determining volume of a liquid sample flowing through a fluid transfer line ("system 100") in accordance with various embodiments of this disclosure. The system 100 generally includes a fluid sensor system 102, a timer 104, and a controller 106 configured to monitor flow of fluid flowing through a fluid transfer line 108 for sample analysis systems for volume determination. For example, the system 100 can determine volumes of liquid samples transferred to or through analytical systems including, but not limited to, vapor deposition and wafer scanning systems (e.g., an example of which is described with reference to FIGS. 3 through 5), analytical sample preparation systems configured to introduce one or more fluids to a sample fluid for content analysis (e.g., diluents, standards, reactants, or other fluids), sample transfer systems configured to transfer liquid samples from remote sampling stations to analysis systems (e.g., with interleaved gas segments), and the like.

The fluid sensor system 102 includes a plurality of sensors configured to detect the presence and absence of liquids present in the fluid flowing through the fluid transfer line 108 and generate one or more sense signals in response. Alternatively or additionally, the plurality of sensors of the fluid sensor system 102 can detect the presence and absence of gases present in the fluid flowing through the fluid transfer line 108, such as gas segments present prior to or after liquid sample segments in the fluid transfer line 108 or bubbles present in the fluid transfer line 108, and generate one or more sense signals in response. Output from the fluid sensor system 102 (e.g., sense signals in response to the presence or absence of liquids or gases) can be transmitted or otherwise made available to the controller 106 for processing (e.g., via one or more memory devices). The system 100 can monitor the timing of the activity of the fluid sensor system 102 via the timer 104, where output from the timer 104 can be transmitted or otherwise made available to the controller 106 for processing. For example, the controller 106 can access the output from the fluid sensor system 102 and the timer 104 to perform calculations associated with volumetric flowrates and volume of the fluid flowing through the fluid transfer line 108. The controller 106 can be a dedicated controller for the system 100, can be integrated or associated with one or more components of the system 100, can be associated with a device remote from the system, or can be associated or integrated with combinations of systems and/or devices.

Referring to FIG. 1, the fluid sensor system 102 is shown including a first liquid sensor 110 and a second liquid sensor 112 to detect the presence and absence of liquids present in the fluid flowing through the fluid transfer line 108. Example operations of the first liquid sensor 110 and the second liquid sensor 112 are described further herein with respect to FIGS. 2A through 2D. While FIG. 1 shows two liquid sensors (first liquid sensor 110, second liquid sensor 112), the fluid sensor system 102 is not limited to two sensors or to two liquid sensors and can include more than two sensors, more than two liquid sensors, two gas sensors, more than two gas sensors, at least one gas sensor and at least one liquid sensor, or the like, or combinations thereof. In implementations, one or more of the first liquid sensor 110 and the second liquid sensor 112 include an optical sensor, a pressure sensor, an ultrasonic transducer, a conductivity sensor, or the like, and combinations thereof, to detect the presence and absence of liquids present in the fluid flowing through the fluid transfer line 108.

Referring to FIGS. 2A through 2D, example operations of the first liquid sensor 110 and the second liquid sensor 112 are described to provide data for determination of the volumetric flowrate and volume of a liquid sample segment 200 present in a fluid flowing through the fluid transfer line 108. At a first time (t0), shown in FIG. 2A, the liquid sample segment 200 is transferred through the fluid transfer line 108 until a front end 202 of the liquid sample segment 200 is detected by the first liquid sensor 110. The front end 202 represents the transition from gas (e.g., a gaseous void or bubble in the fluid transfer line 108) to liquid where the liquid sample segment 200 begins to flow. The first liquid sensor 110 then provides an output (e.g., a sense signal) indicative of the detection, which is made available (e.g., via storage, transmission, or the like) to the controller 106. The timer 104 can provide the time at which the front end 202 is detected by the first liquid sensor 110 and make the time available (e.g., via storage, transmission, or the like) to the controller 106. Detection of the front end 202 of the liquid sample segment 200 provides an indication that a liquid segment is now flowing past the first liquid sensor 110 and is approaching the second liquid sensor 112, which is positioned downstream from the first liquid sensor 110 via the fluid transfer line 108.

Figure 2B:
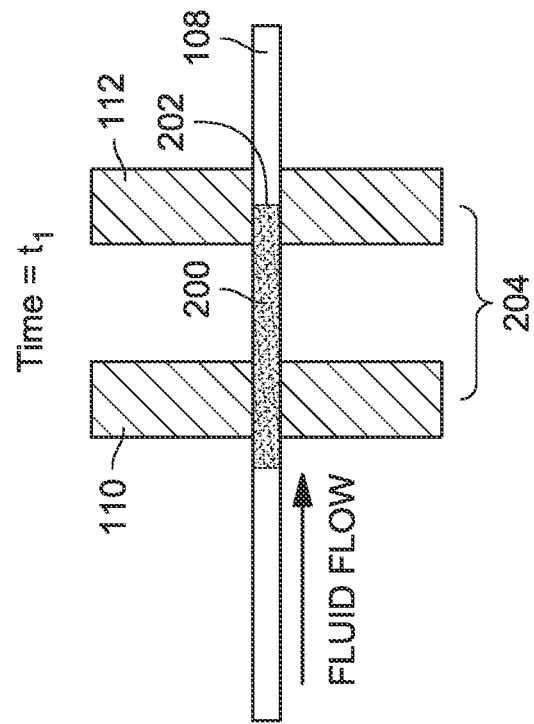
FIG. 2B is a schematic illustration of the liquid volume determination system of FIG. 2A with a second liquid sensor detecting the presence of the liquid segment flowing through the fluid transfer line at a second time.
Figure 2A:
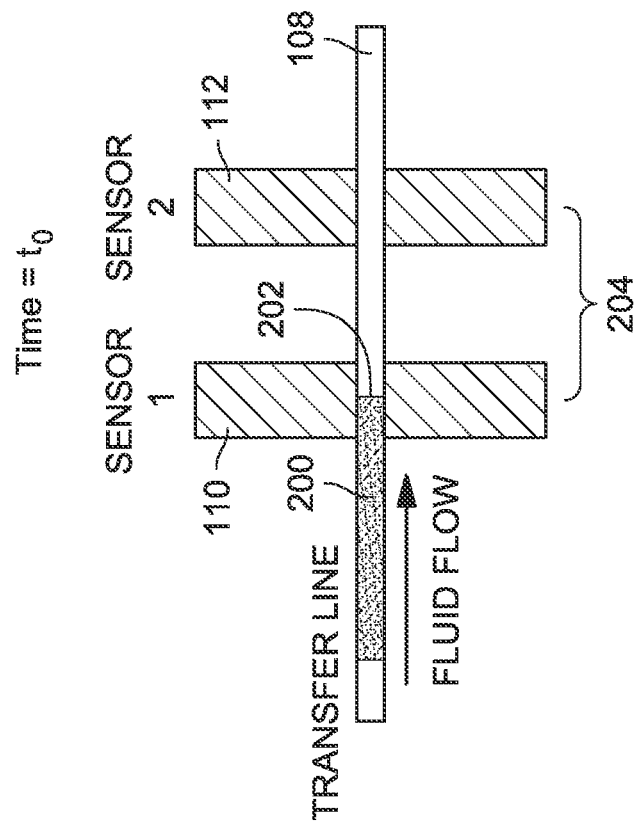
FIG. 2A is a schematic illustration of a liquid volume determination system in accordance with embodiments of this disclosure, with a first liquid sensor detecting the presence of a liquid segment flowing through a fluid transfer line at a first time.

At a second time ($t_1$), shown in FIG. 2B, the liquid sample segment 200 is transferred through the fluid transfer line 108 until the front end 202 of the liquid sample segment 200 is detected by the second liquid sensor 112. The front end 202 of the liquid sample segment 200 traveled a distance of a gap 204 between the first liquid sensor 110 and the second liquid sensor 112 over the duration of time from the first time to the second time. The gap 204 can be a known distance or can have a known volume within the fluid transfer line 108 over the distance of the gap 204 to provide a first measurement of flowrate of the liquid sample segment 200. For example, with a known distance, varying sizes of fluid transfer lines 108 can be utilized while providing an accurate volume of the fluid transfer lines 108 for the gap 204, whereas with a set fluid transfer line 108 the volume of the fluid transfer line 108 for the gap 204 can remain constant. The second liquid sensor 112 then provides an output (e.g., a sense signal) indicative of the detection, which is made available (e.g., via storage, transmission, or the like) to the controller 106. The timer 104 can provide the time at which the front end 202 is detected by the second liquid sensor 112 and make the time available (e.g., via storage, transmission, or the like) to the controller 106. The controller 106 or another portion of the system 100 can then determine a first volumetric flowrate of the liquid sample segment 200 via equation (1):

$$\text{First Volumetric Flowrate} = \frac{\text{Fixed volume}}{t1 - t0} \quad (1)$$

where Fixed volume is the volume of the fluid transfer line 108 of the gap 204, $t_1$ is the time provided by the timer 104 when the second liquid sensor 112 detected the front end 202 of the liquid sample segment 200, and $t_0$ is the time provided by the timer 104 when the first liquid sensor 110 detected the front end 202 of the liquid sample segment 200.

Figure 2C:
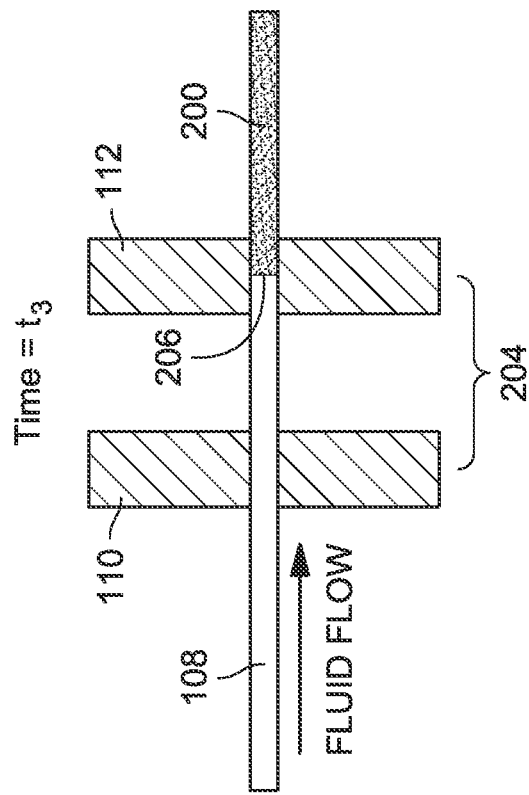
FIG. 2C is a schematic illustration of the liquid volume determination system of FIG. 2A with the first liquid sensor detecting the presence of the back end of the liquid segment flowing through the fluid transfer line at a third time.

At a third time ($t_2$), shown in FIG. 2C, the liquid sample segment 200 is transferred through the fluid transfer line 108 until a back end 206 of the liquid sample segment 200 is detected by the first liquid sensor 110. The back end 206 represents the transition from liquid of the liquid sample segment 200 back to gas (e.g., a gaseous void or bubble in the fluid transfer line 108) indicating an end of the liquid sample segment 200 within the fluid transfer line 108 or a bubble that segments the liquid sample segment 200 into multiple fluid sample portions. The first liquid sensor 110 then provides an output (e.g., a sense signal) indicative of the detection, which is made available (e.g., via storage, transmission, or the like) to the controller 106. The timer 104 can provide the time at which the back end 206 is detected by the first liquid sensor 110 and make the time available (e.g., via storage, transmission, or the like) to the controller 106. Detection of the back end 206 of the liquid sample segment 200 provides an indication that the end of the liquid sample segment 200 is now flowing past the first liquid sensor 110 and is approaching the second liquid sensor 112.

Figure 2D:
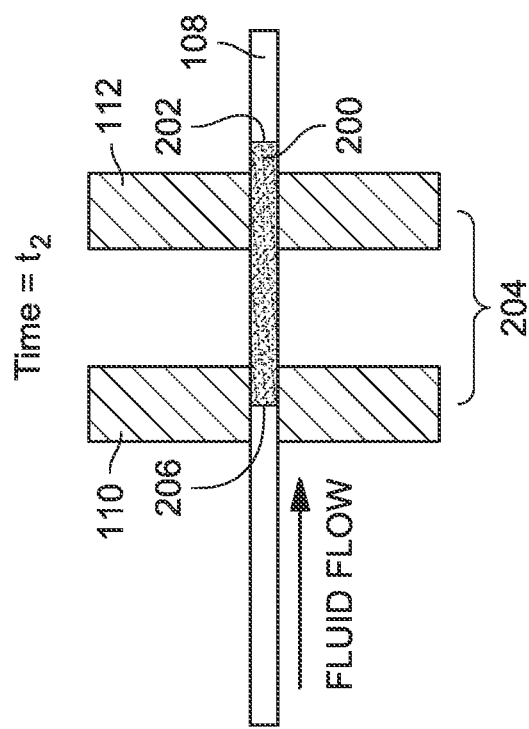
FIG. 2D is a schematic illustration of the liquid volume determination system of FIG. 2A with the second liquid sensor detecting the presence of the back end of the liquid segment flowing through the fluid transfer line at a fourth time.

At a fourth time ($t_3$) shown in FIG. 2D, the liquid sample segment 200 is transferred through the fluid transfer line 108 until the back end 206 of the liquid sample segment 200 is detected by the second liquid sensor 112 following traversal of the gap 204. The second liquid sensor 112 then provides an output (e.g., a sense signal) indicative of the detection, which is made available (e.g., via storage, transmission, or the like) to the controller 106. The timer 104 can provide the time at which the back end 206 is detected by the second liquid sensor 112 and make the time available (e.g., via storage, transmission, or the like) to the controller 106. The controller 106 or another portion of the system 100 can then determine a second volumetric flowrate of the liquid sample segment 200 via equation (2):

$$\text{Second Volumetric Flowrate} = \frac{\text{Fixed volume}}{t3 - t2} \quad (2)$$

where Fixed volume is the volume of the fluid transfer line 108 of the gap 204, $t_3$ is the time provided by the timer 104 when the second liquid sensor 112 detected the back end 206 of the liquid sample segment 200, and 12 is the time provided by the timer 104 when the first liquid sensor 110 detected the back end 206 of the liquid sample segment 200.

An average volumetric flowrate for the liquid sample segment 200 can be calculated via equation (3):

$$\text{Average Volumetric Flowrate} = \frac{\text{Second Volumetric Flowrate} + \text{First Volumetric Flowrate}}{2} \quad (3)$$

The average volumetric flowrate accounts for actual fluid flow conditions of the liquid sample segment 200 through the fluid transfer line 108 and can detect differences in volumetric flowrate between different samples transferred through the system. In implementations, additional liquid sensors can be included to measure additional instances where the liquid sample segment 200 travels through the fluid transfer line 108 to provide additional measurements of volumetric flowrate.

The volume of the liquid sample segment 200 can be calculated via equation (4):

$$\text{Volume} = \frac{t2 - t0}{\text{Average Volumetric Flowrate}} \quad (4)$$

Figure 3:
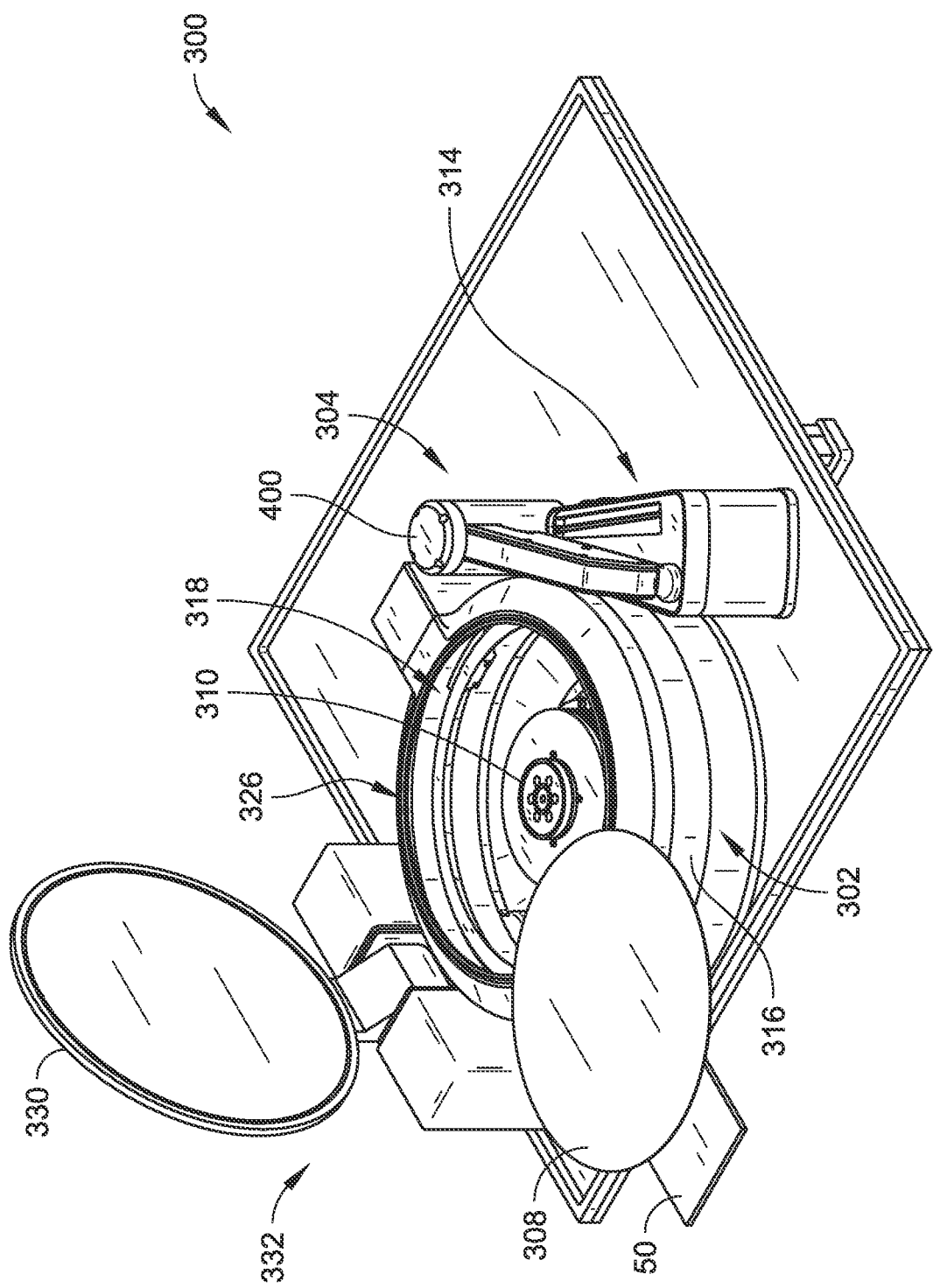
FIG. 3 is an isometric view of a system for integrated decomposition and scanning of a semiconducting wafer, in accordance with embodiments of this disclosure.
Figure 4:
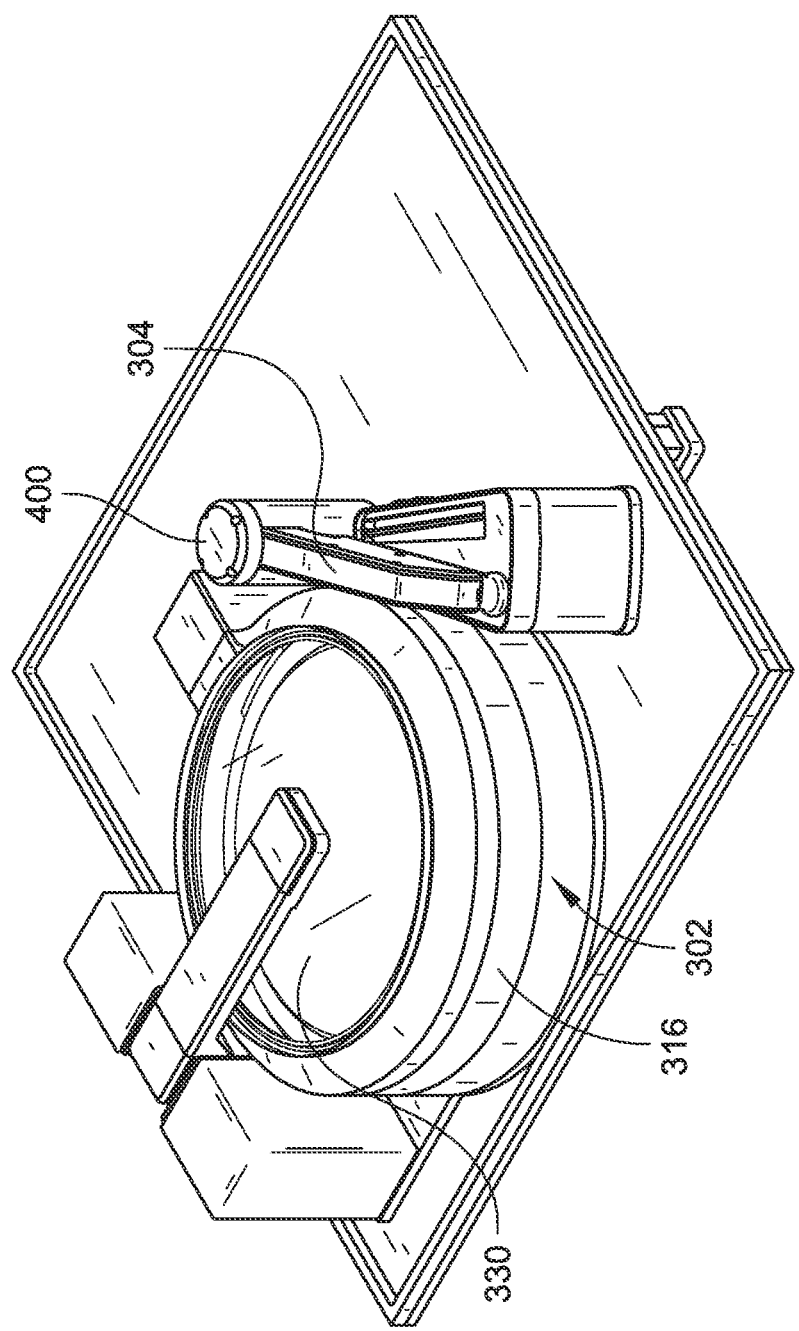
FIG. 4 is an isometric view of the system of FIG. 3 with a semiconducting wafer positioned within a chamber.
Figure 5:
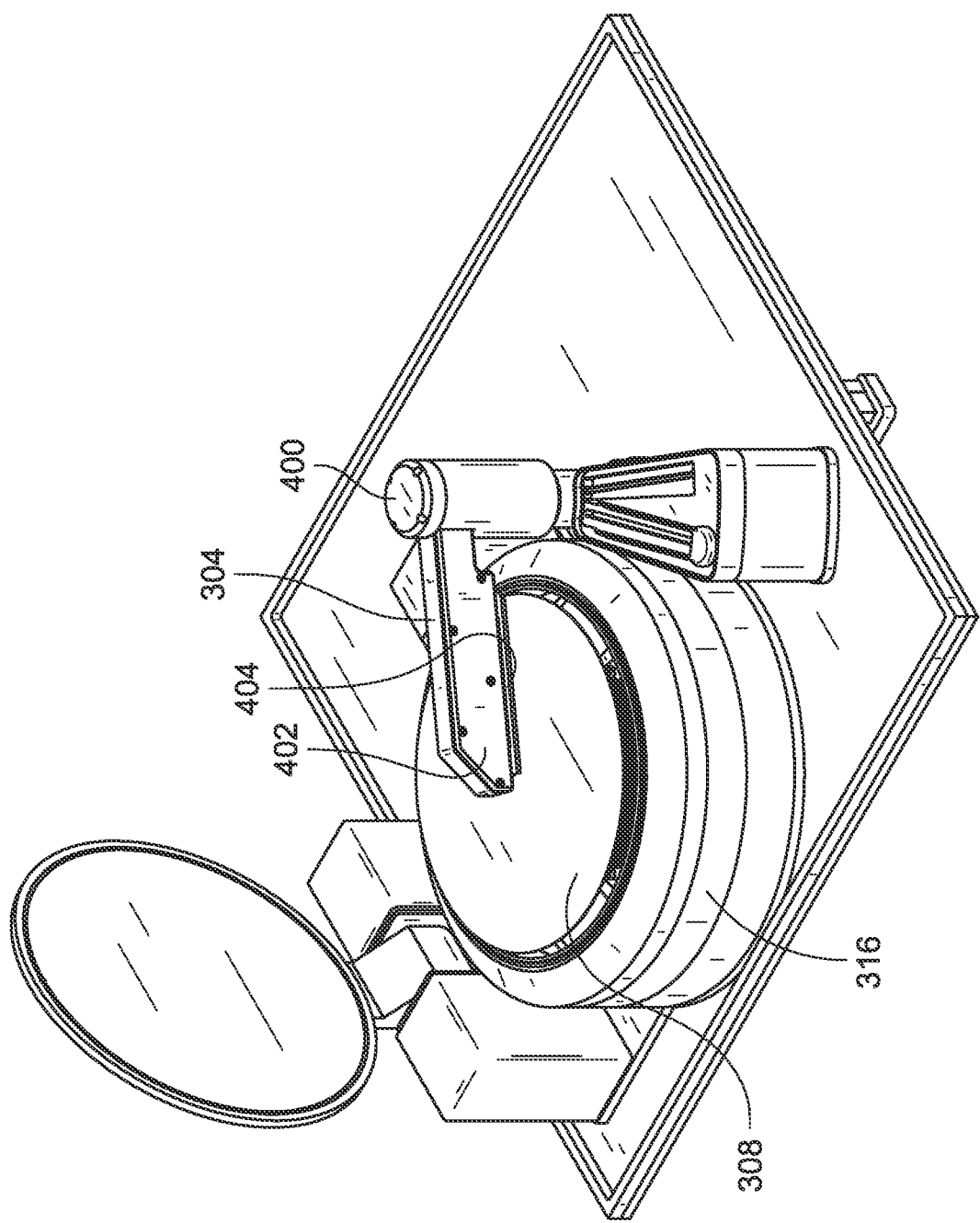
FIG. 5 is an isometric view of the system of FIG. 3, with a scan arm positioning a nozzle over a surface of the semiconducting wafer.

As described herein, the system 100 can be utilized with a semiconductor wafer processing system to determine the volume of liquid introduced onto the surface of a wafer via a scan nozzle, to determine the volume of liquid removed from the surface of the wafer via the scan nozzle, and to compare the volume of liquid introduced to the volume of liquid removed to determine whether residual fluid is left on the wafer, whether substantial evaporation of fluid occurred on the wafer, or the like, or combinations thereof. An example wafer processing system 300 is shown in FIGS. 3 through 5 including a chamber 302 and a scan arm assembly 304 supported a fluid handling system and a motor system to facilitate at least decomposition and scanning procedures of a semiconducting wafer 308 (sometimes referred to herein as the "wafer") through introduction of decomposition fluids to the wafer and through introduction to and removal of scanning fluids from one or more surfaces of the wafer 308. The chamber 302 provides an environment for each of wafer decomposition and wafer scanning with a single chamber footprint, and includes a wafer support 310 to hold the wafer 308 and a motor system to control a vertical position of the wafer support 310 with respect to the chamber 302 (e.g., within the chamber 302, above the chamber 302, etc.) to position the wafer 308 for the decomposition and scanning procedures or during other procedures of the system 100 (e.g., rinsing, etc.). The motor system additionally provides rotational control of the wafer support 310 to rotate the wafer 308 during various procedures of the system 300, and provides rotational and vertical control of the scan arm assembly 304 to bring a nozzle 404 of the scan arm assembly 304 into positions over the wafer 308 during scanning procedures (e.g., shown in FIG. 5) and into positions of a rinse station 314 for nozzle cleaning. In implementations, the wafer support 310 includes a vacuum table to hold the wafer 308 fixed relative to the wafer support 310, such as during movement of the wafer support 310.

The chamber 302 includes a chamber body 316 defining an interior region 318 to receive the wafer 308 for processing. During an example operation shown in FIG. 3, the system 300 can receive a semiconducting wafer 308, or another material, onto the wafer support 310, such as through operation of an automated arm 50 selecting a wafer 308 from a front end unified pod (FOUP) or other location and introducing the selected wafer 308 onto the wafer support 310 (e.g., centered on the wafer support 310). The motor system can position the wafer support 310 at, above, or adjacent to a top portion of the chamber body 316 to permit access to the wafer support 310 by the automated arm 50 to set the wafer 308 onto the wafer support 310. For instance, the wafer support 310 can be positioned adjacent to an opening 326 at the top of the chamber 302 during loading of the wafer 308.

The system 300 can include a lid 330 to isolate the interior region 318 from an exterior region 332 to facilitate wafer decomposition while limiting exposure of the decomposition fluid to the exterior region 332. For example, the lid 330 can have a size and a shape to cover the opening 326 when positioned over the opening 326. The lid 330 can be positionable between an open position (e.g., shown in FIG. 3) and a closed position (e.g., shown in FIG. 4). The open position can be utilized during wafer loading to provide access to the automated arm 50, during scanning procedures, during wafer unloading procedures, and the like. In implementations, the lid 330 is in the open position when the wafer support 310 is in the first position adjacent to the opening 326 to provide access to the wafer 308 by the nozzle of the scan arm assembly 304. The closed position can be utilized during wafer decomposition procedures to prevent the decomposition fluid from leaving the chamber 302 through the opening 326. In implementations, at least a portion of the lid 330 contacts the chamber body 316 to isolate the interior region 318 from the exterior region 332. The wafer 308 is moved within the interior region 318 through control of the vertical position of the wafer support 310 by the motor system to a second position and through rotational control by the motor system.

Following introduction of the wafer 308 to the wafer support 310, the system 300 can transition to a decomposition configuration to facilitate decomposition of one or more surfaces or edges of the wafer 308. In implementations, the chamber 302 includes a nebulizer or other outlet positioned in the chamber body 316 to spray a decomposition fluid onto the surface of the wafer 308 when the wafer support 310 is at the second position (e.g., shown in FIG. 4). The decomposition fluid can be sprayed directly into the chamber 302 by the nebulizer.

Following decomposition of the wafer 308, the system 300 can transition to a scanning configuration to permit access to one or more surfaces of the wafer 308 by the scan arm assembly 304 without transferring the wafer 308 to a separate scanning system. To transition to the scanning configuration, the motor system can position the wafer support 310 adjacent the opening 326 or otherwise closer to a top of the chamber body 316 to permit access to the surface of the wafer 308 by the scan arm assembly 304. The scan arm assembly 304 generally includes a rotatable arm support 400 coupled to a nozzle housing 402 that supports a nozzle 404 configured to introduce the scan fluid to the surface of the wafer 308 and recover the scan fluid from the surface of the wafer 308. For example, the scan fluid can include, but is not limited to, one or more acids (e.g., hydrofluoric acid, phosphoric acid, nitric acid, etc.) configured to dissolve or otherwise carry impurities present on the surface of the wafer 308 following decomposition.

The motor system can control rotation of the rotatable arm support 400, vertical positioning of the rotatable arm support 400, or combinations thereof, to position nozzle housing 402 and nozzle 404 from one or more positions at the rinse station 314 to one or more positions adjacent or above the wafer 308 (e.g., shown in FIG. 5). In implementations, the rotatable arm support 400 rotates or otherwise moves the nozzle 404 to position the nozzle 404 adjacent the wafer 308 when the wafer support 310 is positioned at the top portion of the chamber 302 and to position the nozzle 404 outside a path of the lid 330 from the open position to the closed position when the wafer support 310 is positioned within an interior of the chamber 302 (e.g., during decomposition). With the nozzle 404 in position adjacent or above the wafer 308 (e.g., shown in FIG. 5), the fluid handling system can control introduction of scanning fluids to and from the nozzle 404 to facilitate scanning procedures of the surface of the wafer 308.

Figure 6:
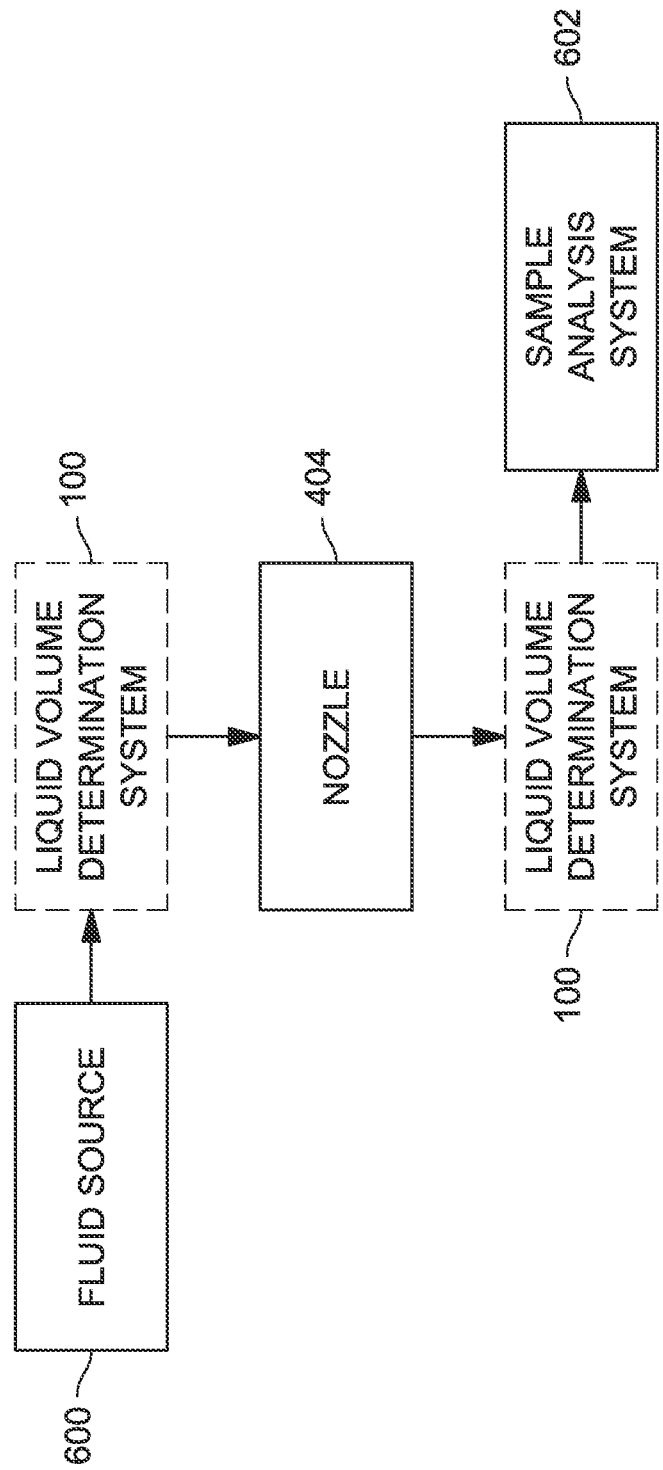
FIG. 6 is a diagrammatic illustration of a system for determining volume of a liquid sample in a wafer scanning and analysis system, in accordance with embodiments of this disclosure.

In implementations, an example of which is shown in FIG. 6, the system 100 is included between the nozzle 404 and a fluid source 600 for supplying fluid (e.g., decomposition fluid, rinse fluid, etc.) to the wafer 308 via the nozzle 404 to determine a volume of fluid introduced to the wafer 308 via the nozzle 404. Alternatively or additionally, the system 100 can be included between the nozzle 404 and a sample analysis system 602 (e.g., an ICP analytical system, etc.) to determine a volume of fluid removed from the wafer 308 via the nozzle 404. In implementations, the system 100 compares the volume of fluid introduced to the wafer 308 via the nozzle 404 with the volume of fluid removed from the wafer 308 via the nozzle 404 to determine an amount of residual liquid remaining on the wafer 308, an amount of liquid that evaporated between dispensing onto the wafer 308 and recovering from the wafer 308, or the like, or combinations thereof.

Figure 7:
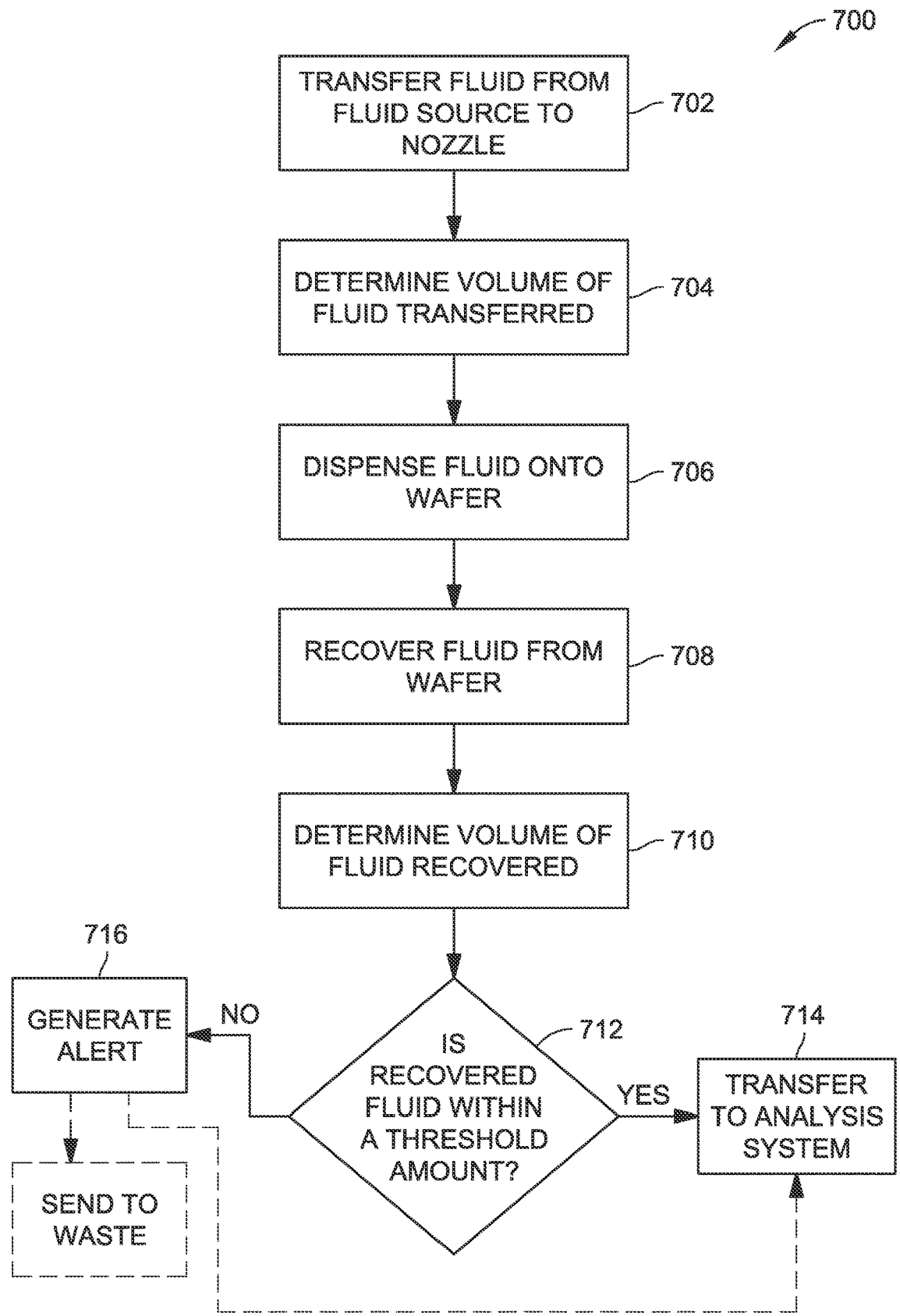
FIG. 7 is a flow chart of an operation for determining whether fluid remains on a wafer surface following recovery by a scanning nozzle, in accordance with embodiments of this disclosure.
Figure 8:
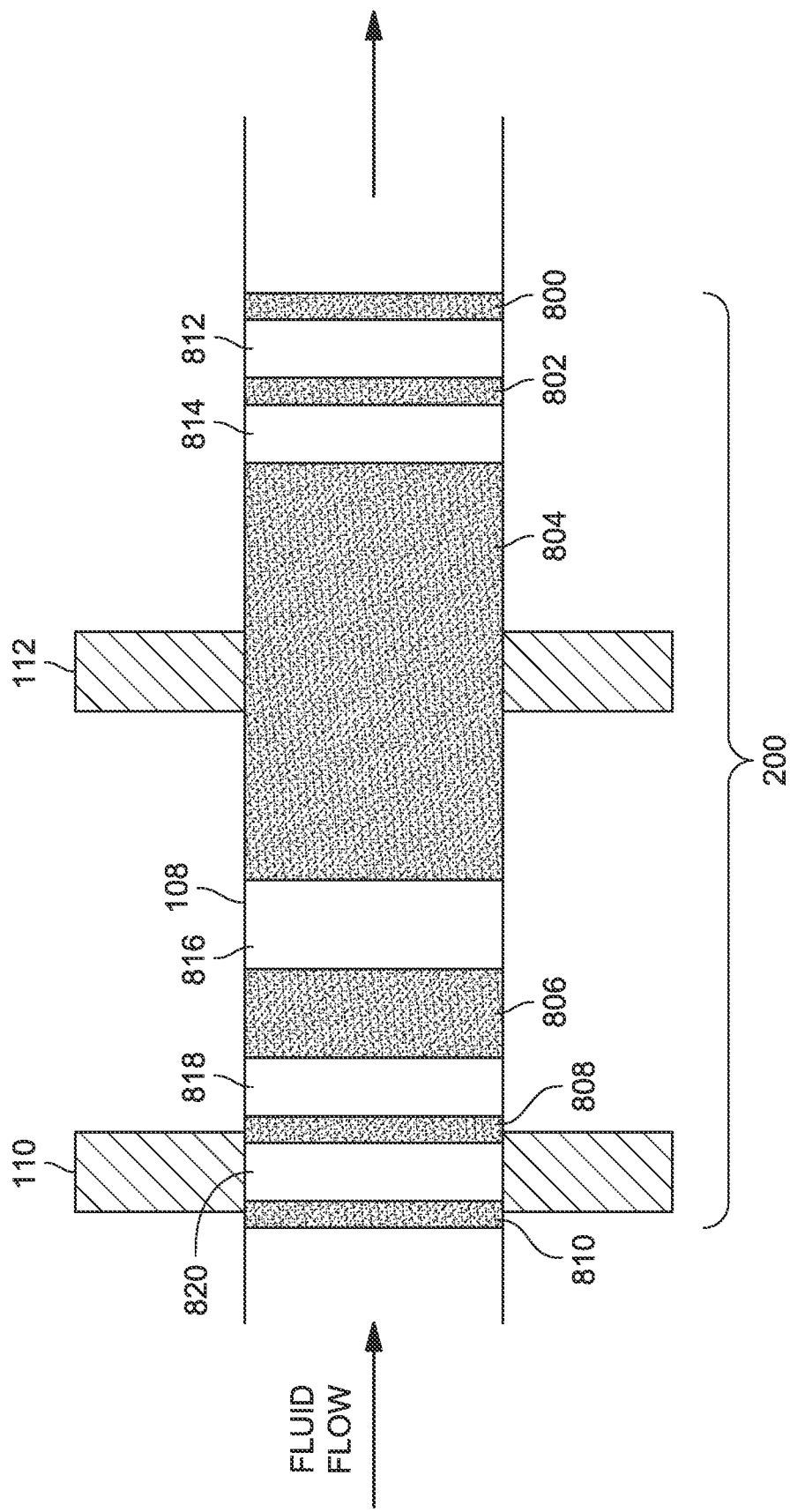
FIG. 8 is a schematic illustration of a liquid volume determination system in accordance with embodiments of this disclosure, with volumes of liquid and gas segments individually determined.

An example operation 700 of the system 100 is shown in FIG. 7 to determine whether fluid remains on the wafer 308, or how much fluid remains on the wafer 308, following fluid recovery during a decomposition or rinse procedure. Operation 700 includes transferring fluid from a fluid source to a nozzle of a wafer processing system, in block 702. For example, the fluid from the fluid source 600 can be transferred from the fluid source 600 to the nozzle 404 via a pump, vacuum source, or the like. The fluid can include, for example, a scanning fluid configured to dissolve or otherwise carry impurities present on the surface of the wafer 308 following decomposition (e.g., vapor phase decomposition) of the wafer surface. Operation 700 also includes determining a volume of the fluid transferred to the nozzle, in block 704. For instance, a first liquid volume determination system 100 can detect the flow of fluid between the fluid source 600 and the nozzle 404 (e.g., as shown in FIG. 6) using a first fluid sensor 110 and a second fluid sensor 112 positioned adjacent the fluid transfer line between the fluid source 600 and the nozzle 404 and the volume can be calculated as described herein.

Operation 700 also includes dispensing the fluid received from the fluid source onto the wafer, in block 706. For example, the system 100 can introduce the fluid received from the fluid source 600 onto the wafer 308 via the nozzle 404 through action of a pump, vacuum source, or the like. In implementations, the fluid is introduced onto the wafer 308 via the nozzle 404 during rotation of the wafer 308 to scan the surface of the wafer 308 with the nozzle 404 maintaining the fluid under controlled contact with the surface to dissolve or otherwise carry impurities present on the surface of the wafer 308 during the scanning operation. In implementations, all or substantially all of the volume of fluid received from the fluid source 600 is introduced to the wafer 308 via the nozzle 404 such that the volume of fluid detected by the first liquid volume determination system 100 is the volume of fluid introduced to the wafer 308. Operation 700 also includes recovering fluid from the wafer, in block 708. For example, fluid on the surface of the wafer 308 can be drawn back into the nozzle 404 through action of a pump, vacuum source, or the like. In implementations, the nozzle 404 controls fluid movement from the surface to avoid fracturing a stream of the fluid to prevent substantial fluid from being retained on the surface of the wafer 308. However, conditions on the wafer 308 (e.g., inconsistent hydrophobicity, temperature gradients, surface imperfections, etc.) can result in portions of the fluid remaining on the surface, evaporating from the surface, spilling from the surface, or otherwise not being drawn from the surface by the nozzle 404. In such instances, determining whether a sufficient amount of fluid has been recovered by the nozzle 404 can provide an indication as to whether substantial amounts of fluid remain on the surface or were otherwise lost.

Operation 700 also includes determining a volume of the fluid recovered from the nozzle, in block 710. For instance, a second liquid volume determination system 100 can detect the flow of fluid between the nozzle 404 and a sample analysis system 602 (e.g., as shown in FIG. 6) using a first fluid sensor 110 and a second fluid sensor 112 positioned adjacent the fluid transfer line between the nozzle 404 and the sample analysis system 602 and the volume can be calculated as described herein.

Operation 700 further includes determining whether the fluid recovered from the wafer via the nozzle is within a threshold amount, in block 712. For example, the controller 106 and/or other portion of the system 100 can compare the volume of fluid recovered from the wafer 308 via the nozzle 404 (e.g., as measured by the second liquid volume determination system 100) to the volume of fluid introduced to the wafer 308 via the nozzle 404 (e.g., as measured by the first liquid volume determination system 100). If the recovered volume differs significantly from the introduced volume, then the system 100 may determine that an erroneous sampling operation occurred. For example, excess fluid may be retained on the wafer 308, excess fluid may have evaporated off the wafer 308, fluid may have spilled from the wafer surface, or the like. In implementations, the difference in volume can be considered a significant difference if the recovered volume is less than about 70% of the introduced volume. For example, the difference in volume can be considered a significant difference if the recovered volume is less than about 80% of the introduced volume, the difference in volume can be considered a significant difference if the recovered volume is less than about 85% of the introduced volume, the difference in volume can be considered a significant difference if the recovered volume is less than about 90% of the introduced volume, the difference in volume can be considered a significant difference if the recovered volume is less than about 95% of the introduced volume, the difference in volume can be considered a significant difference if the recovered volume is less than about 99% of the introduced volume, or the like. While the threshold amount has been described through volume comparison between dispensed and recovered volumes, the system 100 is not limited to such thresholds. For example, in implementations, the system 100 can include an alternative or additional threshold based on a specific volume or a minimum volume. For example, the system 100 can determine whether the recovered volume is within a particular range from a specific volume (e.g., within plus or minus 5% of 500 µL) or meets or exceeds the minimum volume (e.g., at least 500 µL). Different thresholds, values, or both can be utilized without departing from the scope of this disclosure.

If the fluid recovered from the wafer via the nozzle is within a threshold amount in block 712, the operation 700 proceeds to block 714 where the fluid is transferred to an analysis system. For example, if the fluid recovered from the wafer 308 from the nozzle 404 is at least 70%, 80%, 85%, 90%, 95%, 99%, or the like, of volume of fluid initially introduced to the wafer 308, then the system 100 can transfer the fluid to the sample analysis system 602 for quantitative determination of one or more chemical species present in the fluid, such as through analysis of the fluid by ICP spectrometry instrumentation. In implementations, the fluid recovered from the wafer 308 is held in a transfer line, holding loop, or the like until the system 100 determines that the recovery amount is within the threshold. The system 100 can then automatically engages a pump system, automatically switch a valve, or combinations thereof, to direct the fluid to the sample analysis system 602 upon determination of sufficient amount of fluid present. In implementations, if the fluid recovered from the wafer via the nozzle is within a threshold amount, the system 100 can provide an indication that the nozzle 404 successfully removed the sample from the wafer 308, such as through generating an output signal associated with a successful scanning operation.

If the fluid recovered from the wafer via the nozzle is not within the threshold amount in block 712, the operation 700 proceeds to block 716 where the system generates an alert. For example, if the fluid recovered from the wafer 308 from the nozzle 404 is not at least 70%, 80%, 85%, 90%, 95%, 99%, or the like, of the volume of fluid initially introduced to the wafer 308, then the system 100 determines that an insufficient amount of fluid was recovered from the surface of the wafer 308 and generates a signal, communication, or both indicative of the failure to recover a sufficient amount of fluid. In implementations, the system 100 can receive user input via a user interface to proceed with transfer of the insufficient amount of fluid to the sample analysis system 602 or to send the fluid to waste. Alternatively, the system 100 can process the sample with the sample analysis system 602 and provide an indication that the analysis results are associated with an insufficient amount of fluid, a failed fluid recovery, or the like. In implementations, the fluid recovered from the wafer 308 is held in a transfer line, holding loop, or the like until the system 100 determines that the recovery amount is outside the threshold. The system 100 can then automatically engages a pump system, automatically switch a valve, or combinations thereof, to direct the fluid to waste or otherwise direct the sample analysis system 602 with an alert associated with the insufficient fluid amount.

In implementations, the fluid sensor system 102 can be used to track the progression of air gaps present in the liquid sample segment 200 in the fluid transfer line 108 by monitoring the time between the back end of a first liquid portion and a front end of a next liquid portion in the fluid transfer line at the gap 204. The system 100 can then determine the volume of the air gaps based on the volumetric flowrates of the air gaps and subtract the volume of the air gaps from the volume of the liquid sample segment 200. For example, referring to FIG. 8, the fluid transfer line 108 is shown with the liquid sample segment 200 broken into individual fluid segments 800, 802, 804, 806, 808, and 810 with intervening air gaps 812, 814, 816, 818, and 820. The system 100 utilizes the first fluid sensor 110 and the second fluid sensor 112 to detect the presence or absence of the individual fluid segments and the intervening air gaps, where the volume of the individual fluid segments and the intervening air gaps can be calculated as described herein. The system 100 can store (e.g., in computer memory, remote server, etc.) data associated with the individual fluid segments and the intervening air gaps including, but not limited to, timing of detection of presence/absence, volume, flow rate, etc., and combinations thereof.

The system 100 can then determine the volume of the liquid sample segment 200 by adding the volumes of the individual fluid segments 800, 802, 804, 806, 808, and 810. Data associated with the volume of the intervening air gaps 812, 814, 816, 818, and 820 can be excluded, since inclusion of the corresponding volumes would cause concentration calculations from the sample analysis system 602 to be erroneous. For instance, if the air gaps were included, concentration calculations would assume that the volume of the sample would be greater than it actually was. In implementations, the system can base the volume calculation on the front end or leading surface of the fluid segment 800 and the back end or trailing surface of the fluid segment 810 and subtract the calculated volumes of the intervening air gaps 812, 814, 816, 818, and 820 to determine the volume of the liquid sample segment 200.

Electromechanical devices (e.g., electrical motors, servos, actuators, or the like) may be coupled with or embedded within the components of the system (e.g., system 100 and/or system 300) to facilitate automated operation via control logic embedded within or externally driving the system. The electromechanical devices can be configured to cause movement of devices and fluids according to various procedures, such as the procedures described herein. The system may include or be controlled by a computing system having a processor or other controller configured to execute computer readable program instructions (i.e., the control logic) from a non-transitory carrier medium (e.g., storage medium such as a flash drive, hard disk drive, solid-state disk drive, SD card, optical disk, or the like). The computing system can be connected to various components of the system, either by direct connection, or through one or more network connections (e.g., local area networking (LAN), wireless area networking (WAN or WLAN), one or more hub connections (e.g., USB hubs), and so forth). For example, the computing system can be communicatively coupled to the fluid sensors, the timer, the chamber, the motor system, valves described herein, pumps described herein, other components described herein, components directing control thereof, or combinations thereof. The program instructions, when executed by the processor or other controller, can cause the computing system to control the system (e.g., control pumps, selection valves, actuators, spray nozzles, positioning devices, etc.) according to one or more modes of operation, as described herein.

It should be recognized that the various functions, control operations, processing blocks, or steps described throughout the present disclosure may be carried out by any combination of hardware, software, or firmware. In some embodiments, various steps or functions are carried out by one or more of the following: electronic circuitry, logic gates, multiplexers, a programmable logic device, an application-specific integrated circuit (ASIC), a controller/microcontroller, or a computing system. A computing system may include, but is not limited to, a personal computing system, a mobile computing device, mainframe computing system, workstation, image computer, parallel processor, or any other device known in the art. In general, the term "computing system" is broadly defined to encompass any device having one or more processors or other controllers, which execute instructions from a carrier medium.

Program instructions implementing functions, control operations, processing blocks, or steps, such as those manifested by embodiments described herein, may be transmitted over or stored on carrier medium. The carrier medium may be a transmission medium, such as, but not limited to, a wire, cable, or wireless transmission link. The carrier medium may also include a non-transitory signal bearing medium or storage medium such as, but not limited to, a read-only memory, a random access memory, a magnetic or optical disk, a solid-state or flash memory device, or a magnetic tape.

Furthermore, it is to be understood that the invention is defined by the appended claims. Although embodiments of this invention have been illustrated, it is apparent that various modifications may be made by those skilled in the art without departing from the scope and spirit of the disclosure.

What is claimed is:

1. A method for determining whether liquid remains on a wafer surface following a scanning operation comprising:
    transferring a fluid sample through a fluid transfer line from a fluid source to a scanning nozzle of a wafer processing system;
    dispensing the fluid sample onto a wafer surface with the scanning nozzle;
    determining, via a first liquid volume determination system positioned downstream from the fluid source and upstream from the scanning nozzle, a volume of liquid sample dispensed onto the wafer surface;
    recovering the fluid sample from the wafer surface with the scanning nozzle;
    determining, via a second liquid volume determination system positioned downstream from the scanning nozzle, a volume of liquid sample recovered from the wafer surface;
    comparing, via a controller communicatively coupled with the first liquid volume determination system and the second liquid volume determination system, the volume of liquid sample recovered from the wafer surface to the volume of liquid sample dispensed onto the wafer surface; and
    generating an alert if the volume of liquid sample recovered from the wafer surface is significantly less than the volume of liquid sample dispensed onto the wafer surface.

2. The method of claim 1, wherein the volume of liquid sample recovered from the wafer surface is significantly less than the volume of liquid sample dispensed onto the wafer surface if the volume of liquid sample recovered from the wafer surface is less than about 70% of the volume of liquid sample dispensed onto the wafer surface.

3. The method of claim 1, wherein the volume of liquid sample recovered from the wafer surface is significantly less than the volume of liquid sample dispensed onto the wafer surface if the volume of liquid sample recovered from the wafer surface is less than about 90% of the volume of liquid sample dispensed onto the wafer surface.

4. The method of claim 1, wherein the volume of liquid sample recovered from the wafer surface is significantly less than the volume of liquid sample dispensed onto the wafer surface if the volume of liquid sample recovered from the wafer surface is less than about 95% of the volume of liquid sample dispensed onto the wafer surface.

5. The method of claim 1, further comprising transferring the fluid sample recovered from the wafer surface by the nozzle to an analysis system configured to determine a quantitative amount of one or more chemical species in the fluid sample.

6. The method of claim 1, further comprising automatically transferring the fluid sample recovered from the wafer surface by the nozzle to an analysis system configured to determine a quantitative amount of one or more chemical species in the fluid sample when it is determined that the volume of liquid sample recovered from the wafer surface is not significantly less than the volume of liquid sample dispensed onto the wafer surface.

7. The method of claim 1, wherein the first liquid volume determination system includes a first sensor configured for positioning adjacent the fluid transfer line to detect a time at which a gas/liquid transition passes the first sensor and a second sensor configured for positioning adjacent the fluid transfer line downstream from the first sensor by a gap to detect a time at which a gas/liquid transition passes the second sensor.

8. The method of claim 7, further comprising determining a volumetric flowrate of the fluid sample based on the time at which a gas/liquid transition passes the first sensor, time at which a gas/liquid transition passes the second sensor, and at least one of a distance or volume associated with the gap.

* * * * *